(12) United States Patent
Sugarman

(10) Patent No.: US 6,904,637 B2
(45) Date of Patent: Jun. 14, 2005

(54) SCRUBBER WITH SONIC NOZZLE

(75) Inventor: Michael Sugarman, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 239 days.

(21) Appl. No.: 09/970,472

(22) Filed: Oct. 3, 2001

(65) Prior Publication Data

US 2003/0061675 A1 Apr. 3, 2003

(51) Int. Cl.⁷ .............................. B08B 3/00; B08B 3/12; A47L 25/00
(52) U.S. Cl. ........................... 15/77; 15/102; 134/902; 134/199
(58) Field of Search .................. 15/77, 88.2, 88.3, 15/102; 134/902, 149, 153, 199

(56) References Cited

U.S. PATENT DOCUMENTS

| 5,485,644 | A | | 1/1996 | Shinbara et al. | |
|---|---|---|---|---|---|
| 5,526,835 | A | | 6/1996 | Olechow | |
| 5,858,112 | A | | 1/1999 | Yonemizu et al. | |
| 5,875,507 | A | * | 3/1999 | Stephens et al. | 15/102 |
| 5,906,687 | A | | 5/1999 | Masui et al. | |
| 5,958,145 | A | | 9/1999 | Yonemizu et al. | |
| 5,975,098 | A | | 11/1999 | Yoshitani et al. | |
| 6,151,744 | A | | 11/2000 | Ohtani et al. | |
| 6,173,468 | B1 | | 1/2001 | Yonemizu et al. | |
| 6,202,658 | B1 | * | 3/2001 | Fishkin et al. | 134/147 |
| 6,334,229 | B1 | * | 1/2002 | Moinpour et al. | 15/77 |
| 6,385,805 | B2 | * | 5/2002 | Konishi et al. | 15/77 |
| 6,523,553 | B1 | * | 2/2003 | Redeker et al. | 134/61 |

FOREIGN PATENT DOCUMENTS

| JP | 404123827 | 8/1992 |
|---|---|---|
| JP | 05134398 | 5/1993 |
| JP | 07086218 | 3/1995 |
| JP | 07086222 | 3/1995 |
| JP | 10004072 | 8/1996 |
| JP | 09260321 | 10/1997 |
| JP | 10199849 | 7/1998 |
| JP | 11087288 | 3/1999 |
| JP | 11238713 | 8/1999 |
| WO | WO 00/59006 | 10/2000 |

* cited by examiner

Primary Examiner—Robert J. Warden, Sr.
Assistant Examiner—Laura C Cole
(74) Attorney, Agent, or Firm—Dugan & Dugan

(57) ABSTRACT

An apparatus for cleaning a substrate is provided. The apparatus comprises a plurality of rollers adapted to support a substrate in a vertical orientation, a scrubber brush adapted to contact a substrate supported by the plurality of rollers, and a sonic nozzle positioned at an elevation below the elevation of the scrubber brush and adapted so as to output a sonicated fluid spray that contacts a beveled edge or a major surface of the substrate such that fluid having sufficient sonic energy to harm the scrubber brush will not contact the scrubber brush.

11 Claims, 4 Drawing Sheets

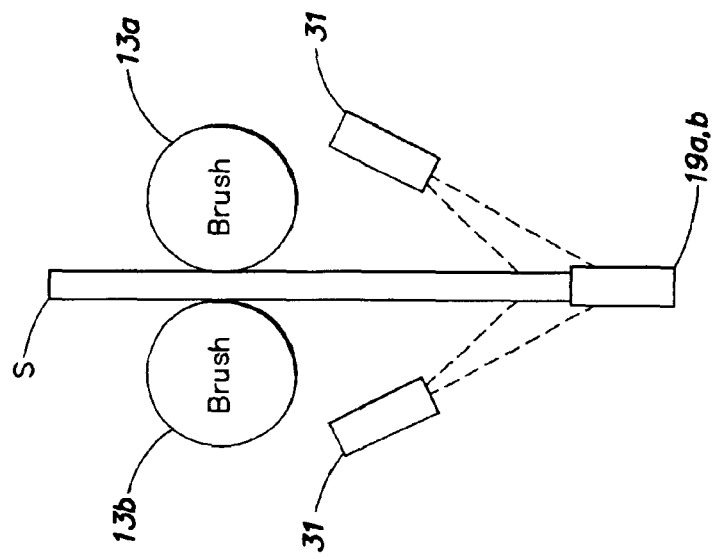
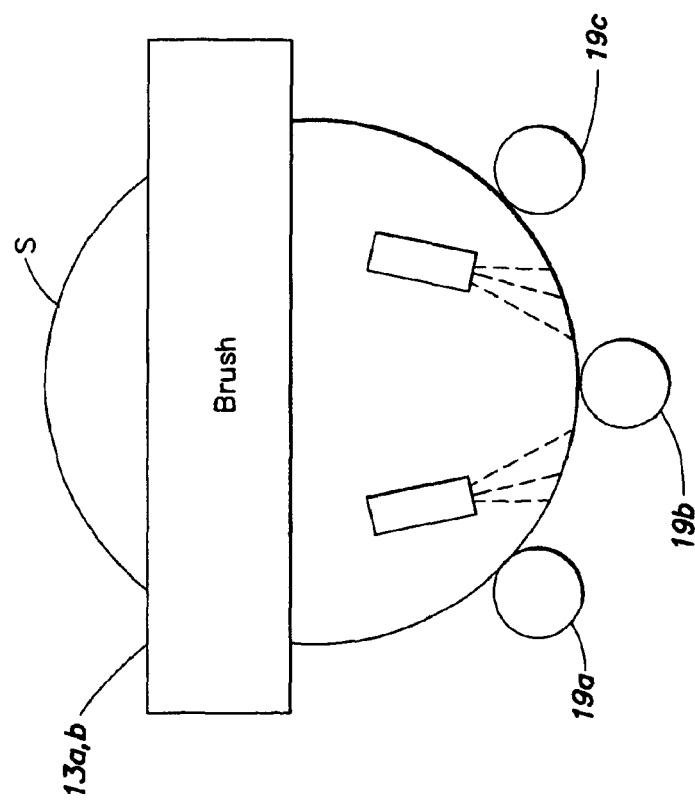
FIG. 2B
FIG. 2A

SCRUBBER WITH SONIC NOZZLE

FIELD OF THE INVENTION

The present invention relates to apparatuses and methods adapted to scrub thin substrates or substrates such as semiconductor substrates, compact discs, glass substrates, and the like. More particularly, the present invention relates to a method of sonically cleaning a substrate in an apparatus adapted to scrub a vertically oriented substrate.

BACKGROUND OF THE INVENTION

During formation of a semiconductor device, various layers (e.g. oxides) require planarization to remove steps or undulations prior to formation of subsequent layers. Planarization is typically performed mechanically by forcing a semiconductor substrate face down against a semi-porous polishing pad which is saturated with an abrasive compound (i.e., a slurry) and by rotating the polishing pad relative to the semiconductor substrate. The slurry reacts with the substrate's surface, which makes the surface easier to remove, and the rotary motion between the polishing pad and the substrate mechanically removes layers of the intermediate oxide and is continued until the oxide steps or undulations are removed.

After polishing, slurry residue is conventionally cleaned or scrubbed from the substrate surfaces via mechanical scrubbing devices, which may employ polyvinyl acetate (PVA) brushes, or brushes made from other porous or sponge-like material, or brushes made with nylon bristles, etc. It is known to combine a scrubbing device with one or more nozzles that output sonically energized fluid. Although such devices may remove the majority of slurry and other particulates from a substrate's surfaces, often residual slurry and other particulates may remain particularly along a substrate's beveled edge, where scrubber brushes and sonic fluid sprays may not uniformly contact the substrate's surface.

Accordingly, a need remains for an improved method and apparatus for simultaneous scrubbing and sonically cleaning a substrate.

SUMMARY OF THE INVENTION

The present inventor believes that megasonic energy has a deleterious effect on brushes made of sponge-like material such as the PVA brushes which are so widely used in the semiconductor industry. Accordingly the present inventor has provided an improved scrubber and method for scrubbing substrates, such as semiconductor substrates. The inventive method comprises supporting a substrate in a vertical orientation, contacting a major surface of the substrate with a scrubber brush, and impacting the surface of the substrate with sonicated fluid at a location below the scrubber brush, wherein the sonicated fluid impacts the substrate with an angle that deters sonicated fluid from contacting the scrubber brush (i.e., an angle that does not direct the sonicated fluid upwardly).

In one aspect the inventive apparatus comprises a scrubber adapted to scrub a vertically oriented substrate via a pair of sponge-like roller brushes, each positioned so as to contact one of the substrate's major surfaces along the diameter thereof. One or more sonic nozzles for outputting sonic fluid are positioned below each roller brush and angled such that sonicated fluid output therefrom is deterred from contacting the scrubber brush. Thus, because of the relative position between the roller brush and the sonic nozzle, the angle of the sonicated fluid output by the nozzle, and the general effects of gravity, sonicated fluid is deterred from contacting the roller brush. In this aspect the sonic nozzles may be further angled such that the sonicated fluid spray output therefrom impacts the substrate's beveled edge. The fluid spray may impact the substrate's beveled edge in a region where a substrate support is not located such that the sonicated fluid and particles are not obstructed from leaving the substrate's surface. In this aspect the sonic nozzles may be positioned such that sonicated fluid is directed off of the substrate (as described below with reference to the figures).

The invention may also be employed in systems that are inclined from horizontal (but not completely vertical), wherein sonic nozzles are positioned below the scrubber brush so that gravity deters fluid from contacting the scrubber brush.

BRIEF DESCRIPTION OF THE DRAWINGS

FIGS. 2A and 2B are a front and side elevational view, respectively, of an inventive scrubber;

DETAILED DESCRIPTION OF THE PREFERRED EMBODIMENTS

Figure 1:
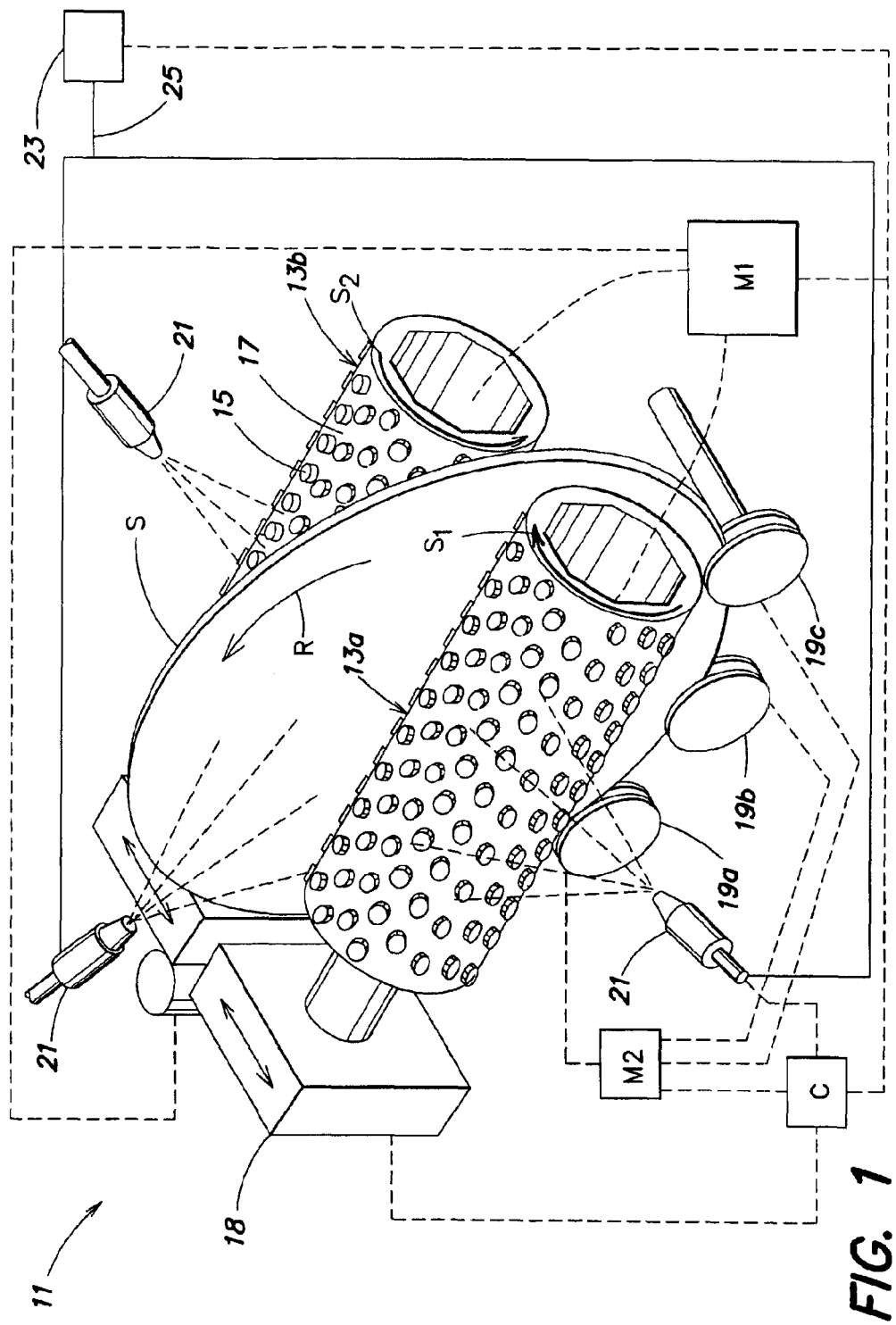
FIG. 1 is a side perspective view of an inventive scrubbing device that may perform the inventive scrubbing method (inventive nozzles are shown in FIGS. 2A–3B only)

FIG. 1 is a side perspective view of one embodiment of an inventive scrubbing device 11 that may perform the inventive scrubbing method. The inventive scrubbing device 11 comprises a pair of PVA brushes 13a, 13b. Each brush may comprises a plurality of raised nodules 15 across the surface thereof, and a plurality of valleys 17 located among the nodules 15. The PVA brushes 13a, 13b may be supported by a pivotal mounting (represented generally by reference number 18) adapted to move the PVA brushes 13a, 13b into and out of contact with the substrate S supported by the substrate support 19, thus allowing the PVA brushes 13a, 13b to move between closed and open positions so as to allow a substrate S to be extracted from and inserted therebetween.

The scrubber device 11 also comprises a substrate support 19 adapted to support and further adapted to rotate a substrate S. In one aspect, the substrate support 19 may comprise a plurality of rollers 19a–c each having a groove adapted to support the substrate S vertically. A first motor M1 is coupled to the PVA brushes 13a, 13b and adapted to rotate the PVA brushes 13a, 13b. A second motor M2 is coupled to the rollers 19a–c and adapted to rotate the rollers 19a–c.

The scrubbing device 11 may further comprise a plurality of spray nozzles 21 coupled to a source 23 of fluid via a supply pipe 25. The spray nozzles 21 may be positioned to spray a fluid (e.g., deionized water, SC1, dilute hydrofluoric acid or any other liquid solution used for cleaning) at the surfaces of the substrate S or at the PVA brushes 13a, 13b during substrate scrubbing. Alternatively or additionally fluid may be supplied through the scrubber brushes themselves as is conventionally known, or scrubber brushes that have complexing agents adapted to bond to, and thereby remove particles may be employed.

A pair of sonic nozzles 31 (shown only in FIGS. 2A–3B are positioned so as to supply sonicated fluid to the front surface of the substrate S, and a pair of sonic nozzles 31 are positioned so as to supply sonicated fluid to the back surface of the substrate S, as best seen with reference to FIGS. 2A and 2B. Both pairs of sonic nozzles 31 are located below the PVA brushes 13a, 13b, and each sonic nozzle 31 is angled such that the sonicated fluid output therefrom is directed within plus or minus 90 degrees of a vertical line 33 drawn at the point of fluid impact, (as shown by angles $\emptyset_1$ and $\emptyset_2$ in FIG. 3A) and, if directed to the substrate's bevel, within an angle defined between a tangent to each bevel of the substrate S and a horizontal line 35 drawn at the point of fluid impact (as shown by angles $\emptyset C_1$ and $\emptyset C_2$ in FIG. 3B). Thus, because of the relative position between the roller brush and the sonic nozzle, the angle of the sonicated fluid output by the nozzle, and the general effects of gravity, sonicated fluid is deterred from contacting the roller brush.

Figure 3B:
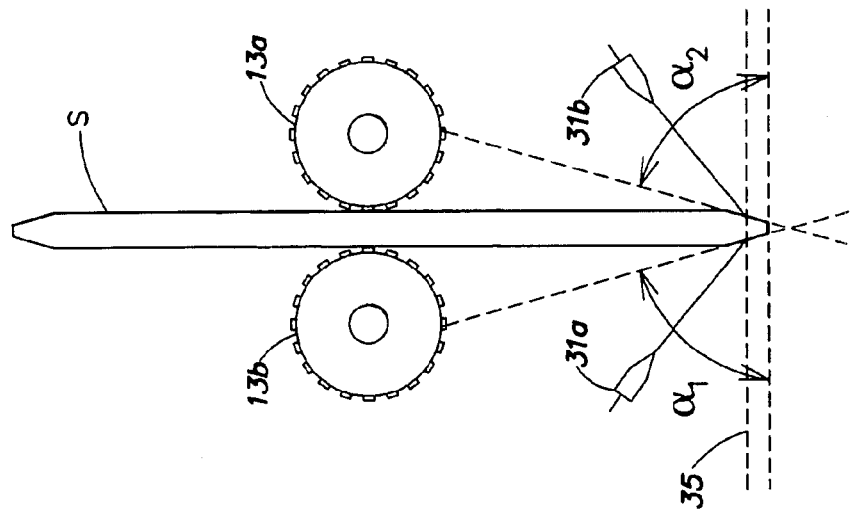
FIGS. 3A and 3B are a front and a side elevational view, respectively, showing the position of the sonic nozzle relative to a substrate.
Figure 3A:
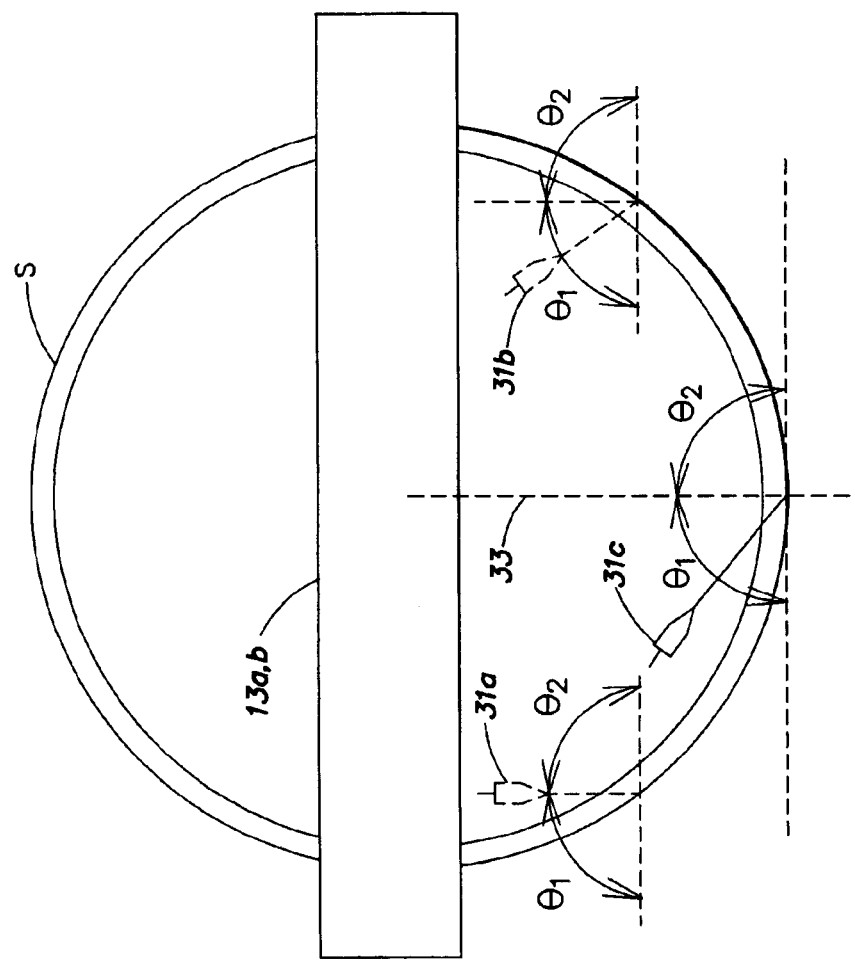

In aspects where the sonic nozzles are angled such that the sonicated fluid spray output therefrom impacts the substrate's beveled edge (as shown,) the sonicated fluid spray may be in line with the substrate's beveled edge ($\propto$ of zero degrees) as best seen with reference to FIGS. 3A and 3B and/or the angle $\emptyset$ may be selected such that sonicated fluid is directed off of the substrate (e.g., nozzle 31a positioned within the angle represented by $\emptyset_2$, nozzle 31b positioned within the angle represented by $\emptyset_1$, and nozzle 31c positioned within either angles $\emptyset_1$ or $\emptyset_2$). The sonic nozzles also may be positioned such that the sonicated fluid spray impacts the substrate's beveled edge in a region where a substrate support is not located (e.g., between adjacent rollers).

The foregoing description discloses only the preferred embodiments of the invention, modifications of the above-disclosed apparatus and method which fall within the scope of the invention will be readily apparent to those of ordinary skill in the art. For instance, the inventive method of scrubbing a substrate with a scrubber brush while simultaneously supplying sonicated fluid to the substrate in such a manner that sonicated fluid is deterred from contacting the scrubber brush may be performed by other apparatuses such as those having a pad type scrubber brush that scans the substrate's surface.

Figure 4:
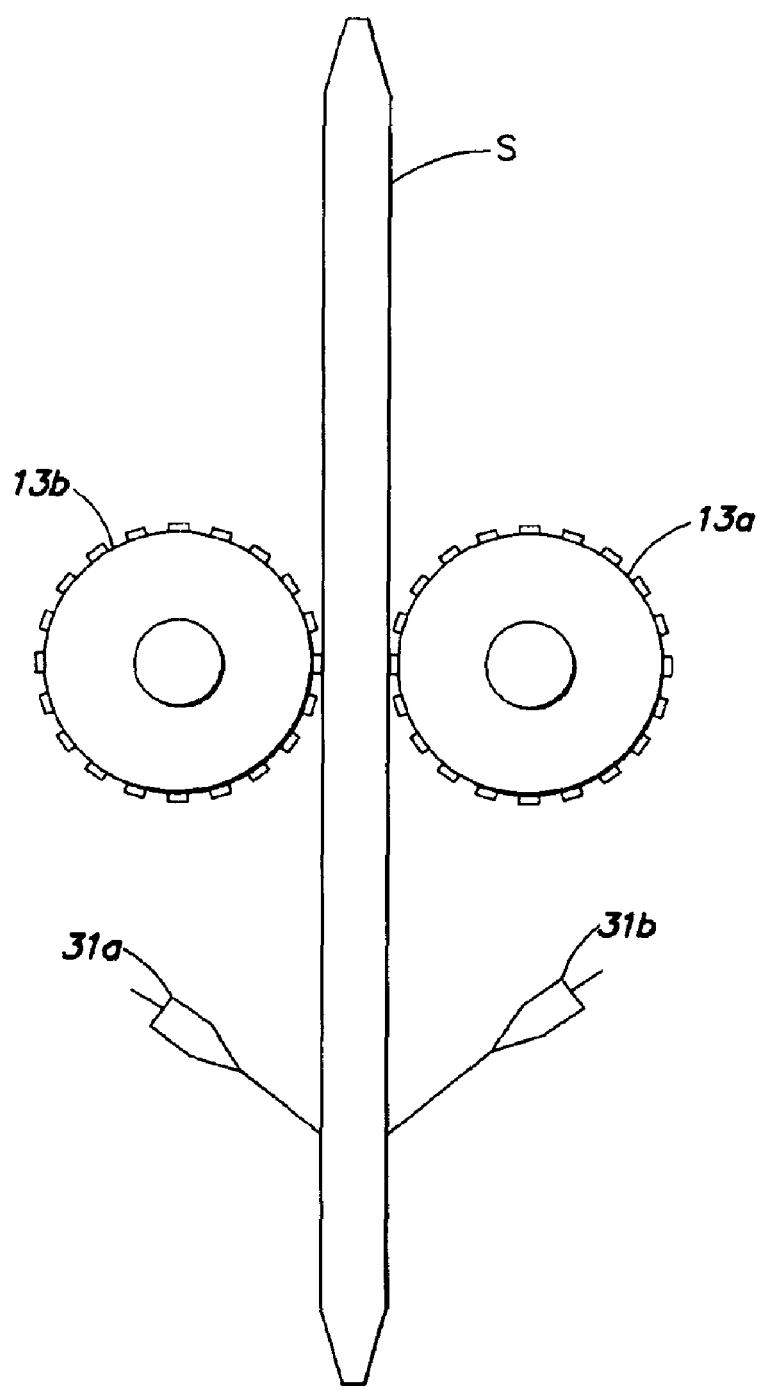
FIG. 4 is a schematic side elevational view showing the position of a major surface cleaning sonic nozzle relative to a substrate.

Similarly, as shown in the schematic side elevational view of FIG. 4, the sonicated fluid may impact the substrate's major surface in a manner such that sonicated fluid is deterred from impacting a scrubber brush (e.g., fluid impact at a position below the scrubber brush and is directed within the $\emptyset_1$ or $\emptyset_2$ range in a vertically oriented system or in a system otherwise inclined from horizontal). In embodiments where sonicated fluid contacts the substrate's major surface, the sonicated fluid should impact the substrate at a distance from the scrubber brush sufficient to prevent sonicated fluid having energy levels that may harm the scrubber brush from contacting the scrubber brush. It will be understood that the sonic energy may dissipate as it travels along the substrate surface.

Accordingly, while the present invention has been disclosed in connection with the preferred embodiments thereof, it should be understood that other embodiments may fall within the spirit and scope of the invention, as defined by the following claims.

What is claimed is:

1. An apparatus for cleaning a substrate, comprising:
    a plurality of rollers adapted to support a substrate in a vertical orientation;
    a scrubber brush adapted to contact the substrate supported by the plurality of rollers; and
    a sonic nozzle positioned at an elevation below the elevation of the scrubber brush and adapted so as to output a sonicated fluid spray that contacts a beveled edge of the vertically oriented substrate located below the sonic nozzle such that fluid having sufficient sonic energy to harm the scrubber brush will not contact the scrubber brush;
    wherein the sonic nozzle is angled so as to direct the sonicated fluid spray towards the vertically oriented substrate, away from the scrubber brush, and at an angle that does not direct sonicated fluid upwardly.

2. The apparatus of claim 1 wherein the sonicated fluid is directed off of the substrate.

3. The apparatus of claim 1 wherein the scrubber brush is adapted to contact a substrate supported by the plurality of rollers along at least a portion of a diameter of the substrate.

4. The apparatus of claim 1 wherein the sonicated fluid spray contacts a beveled edge of a substrate at a position between the plurality of rollers.

5. An apparatus for cleaning a substrate, comprising:
    a plurality of rollers adapted to support a substrate in a vertical orientation;
    a scrubber brush adapted to contact the substrate supported by the plurality of rollers; and
    a sonic nozzle positioned at an elevation below the elevation of the scrubber brush and adapted so as to output a sonicated fluid spray that contacts a major surface of the vertically oriented substrate supported by the plurality of rollers at a position below the roller brush such that fluid having sufficient sonic energy to harm the scrubber brush will not contact the scrubber brush;
    wherein the sonic nozzle is angled so as to direct the sonicated fluid spray towards the vertically oriented substrate, away from the scrubber brush and at an angle that does not direct sonicated fluid upwardly.

6. The apparatus of claim 5 wherein the sonicated fluid is directed off of the substrate.

7. The apparatus of claim 5 wherein the scrubber brush is adapted to contact a substrate supported by the plurality of rollers along at least a portion of a diameter of the substrate.

8. An apparatus for cleaning a substrate, comprising:
    a plurality of rollers adapted to support a substrate in a vertical orientation;
    a scrubber brush adapted to contact the substrate supported by the plurality of rollers; and
    a sonic nozzle positioned at an elevation below the elevation of the scrubber brush and adapted so as to output a sonicated fluid spray that contacts a major surface of or a beveled edge of the vertically oriented substrate supported by the plurality of rollers;
    wherein the sonic nozzle is angled downwardly and away from the scrubber brush so as to direct the sonicated fluid spray towards the vertically oriented substrate away from the scrubber brush and at an angle that does not direct sonicated fluid upwardly.

9. The apparatus of claim 8 wherein the sonicated fluid is directed off of the substrate.

10. The apparatus of claim 8 wherein the scrubber brush is adapted to contact a substrate supported by the plurality of rollers along at least a portion of a diameter of the substrate.

11. The apparatus of claim 8 wherein the sonicated fluid spray contacts the beveled edge of a substrate at a position between the plurality of rollers.

* * * * *